May 27, 1958 M. T. GOODFELLOW ET AL 2,836,807

CERAMIC TERMINAL MOUNT

Filed April 20, 1953

INVENTORS
Marion T. Goodfellow
BY Robert J. Davis
Buckhorn and Cheatham
ATTORNEYS 2,836,807

CERAMIC TERMINAL MOUNT

Marion T. Goodfellow, Beaverton, and Robert J. Davis, Portland, Oreg., assignors to Tektronix, Inc., Portland, Oreg., a corporation of Oregon Application April 20, 1953, Serial No. 349,768

2 Claims. (Cl. 339—275)

This invention relates to terminal mounts.

It is present production practice in a great number of electrical and electronic industries to mount electrical componetns, such as resistors and condensers, on terminal boards of insulating material equipped with spaced parallel rows of terminal elements in the form of posts and the like, about which the ends of the leads of the electrical components may be bent and to which such ends are soldered. Thus, at least initially, the electrical components are supported in spaced, parallel, insulated relation.

Jumpers are provided for connecting those electrical components which it is desired to be connected together. The ends of wires from various other sources are also connected to the posts, in a manner similar to that described above, to convey current to or from the resistors and condensers.

These terminal boards are conventionally mounted on the underside of a metal chassis parallel to the plane of the base of the chassis, to permit ready access to the components for inspection and replacement, and also to permit the components to be readily applied to the terminal boards. It is apparent that these terminal boards occupy considerable space on a chassis. This is a very objectionable feature since the compactness of the arrangement of parts on a chassis in large measure determines the size of the instrument. Because of the increasing complexity of electrical instruments and the consequent increase in the number of component parts, it is apparent that the utmost compactness of parts is essential, if the size of an instrument is to be kept within reasonable limits.

Another disadvantage of the above-described terminal board construction is that the mass of a post is sufficiently large so that a considerable amount of heat is required for a soldering operation. There is thus created a danger of injuring the bodies of electrical components because of excessive heat conducted thereto through their leads when their leads are being soldered to terminal board posts. To decrease this danger, some manufacturers have resorted to the strategem of bending the electrical component leads to increase the length of the leads between a component body and a pair of opposed terminal posts, without increasing the distance between the posts, which would be objectionable as consuming too much space. This procedure has proved generally successful, but the extra operation of bending the leads has added to the expense of producing electrical instruments and devices.

It is a main object of the present invention to provide a terminal mount overcoming all the above-named disadvantages and, in addition, being less expensive than a terminal board. A more particular object of the present invention is to provide a terminal mount comprising a strip of insulating material adapted to be mounted on one edge on the base of a chassis, and having formed along the opposite edge a plurality of spaced notches, the edges of each notch being lined with a thin layer of metal which is of small mass and is coated with solder and has a substantially higher melting point than the solder, whereby two of such strips may be arranged in spaced, parallel, upright relation on a chassis base and the unbent leads of electrical components merely laid in the notches and soldered in place by touching the thin metal linings with a hot soldering iron while simultaneously supplying such additional solder as desired.

It is frequently desirable or necessary to locate electrical components such as resistors and condensers immediately adjacent to a vacuum tube and, at present, this is usually accomplished in the most direct manner, i. e., soldering the leads of the electrical components to the terminals of the vacuum tube socket with the electrical components generally radiating outwardly from the tube and thus occupying considerable space.

It is another object of the present invention to provide a terminal mount having a disc-shaped head and a stem extending therefrom adapted to be fastened to a tube socket centrally thereof, the head having a plurality of radial notches formed in the edge thereof, each socket being lined with a thin layer of metal which is coated with solder and has a substantially higher melting point than the solder whereby resistors and condensers may be arranged upright circumferentially around the terminal mount with one set of leads of the electrical components being soldered to the tube socket terminals and the other set of leads being laid in the notches and soldered thereto by touching the linings with a hot soldering iron.

The invention may be considered more broadly than heretofore indicated and, in a broader sense, the invention contemplates the provision of a body of insulating material having one or more, preferably a plurality of, metalized areas to which flowable solder readily adheres, and which have a higher melting point than the solder, the insulating material having a surface to which flowable solder will not adhere readily or at all whereby, when electrical component leads are soldered to the terminal mount, the flowable solder tends to be confined to the metalized areas.

A further broad object of the present invention is to provide a terminal mount as immediately above described wherein the metalized areas are coated with solder and wherein the surface of the insulating material is glazed.

A further object of the present invention is to provide a method of making the above-described terminal mounts.

For a consideration of what is believed novel and inventive, attention is directed to the following description taken in connection with the accompanying drawings, while the features of novelty will be pointed out with greater particularity in the appended claims.

Figure 1:
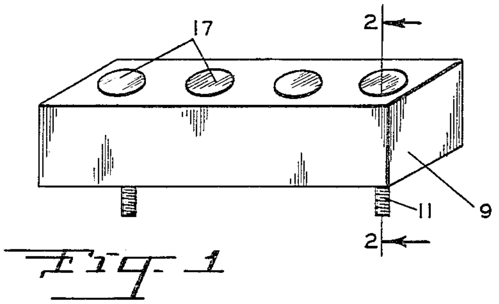
Fig. 1 is a perspective view of a terminal mount embodying the concepts of the present invention.
Figure 2:
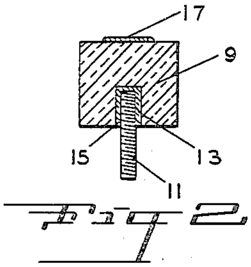
Fig. 2 is a sectional view taken along line 2—2 of Fig. 1.

Referring to the accompanying drawings wherein similar reference characters designate similar parts throughout, Figs. 1 and 2 show a terminal mount comprising a rectangular block of insulating material 9 having depending therefrom threaded studs 11 received within holes 13 formed in the underside of the block and secured in place by cement 15. When the term "insulating material" is used in this application, it is intended to mean that the body in question has both good thermal and electrical insulating properties.

The terminal mount may be secured to a metal frame, such as a sheet-metal chassis, by threading a stand-off nut on each stud 11 up against the body of the mount and inserting the studs through holes in the metal chassis, and then threading nuts onto said studs up against the metal chassis.

Spaced along the upper surface of the block are a plurality of thin metal pieces 17 permanently bonded to the block. For instance, the metal pieces may be formed by applying an electrically conducting silver paste, of a composition to be set out hereinafter, at spaced places to a block of ceramic material, and the thus formed article fired to a temperature to effect a hardening of the silver and a permanent bond therebetween and the block. In any event, it is important that the materials be selected so that the metal pieces have a considerably higher melting point than ordinary soft solder, and that flowable solder have an adhesion to said pieces greater than the cohesion of the solder, and an adhesion to the surface of the insulating block less than the cohesion of the solder. In other words, it is important that the materials be selected so that the metal pieces will be wet, while the insulating block will not be wet, by flowable solder. Thus, when component leads are placed against the metal pieces and solder added in the presence of a hot soldering iron, the solder will tend to be confined to the areas of the metal pieces.

Figure 3:
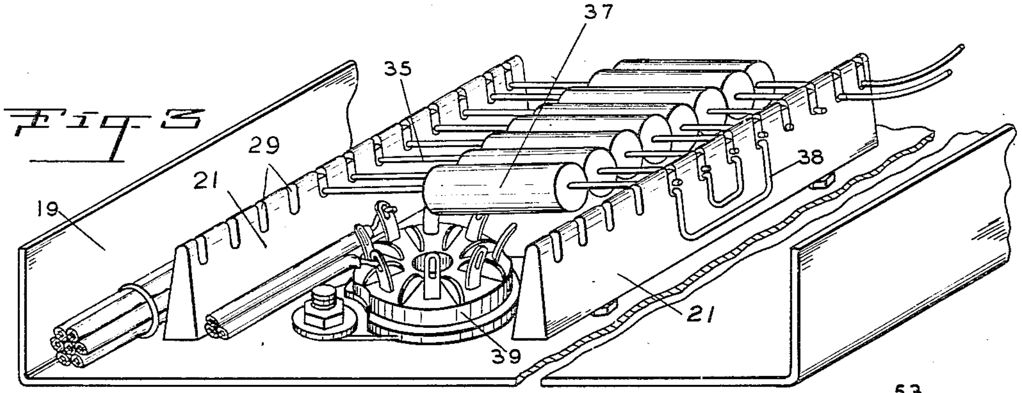
Fig. 3 is a perspective view showing a pair of terminal mounts of a modified form mounted on the underside of a chassis frame and supporting electrical components, the chassis frame having been inverted for convenience in explanation.
Figures 4, 5, 6, 7, 8, 9:
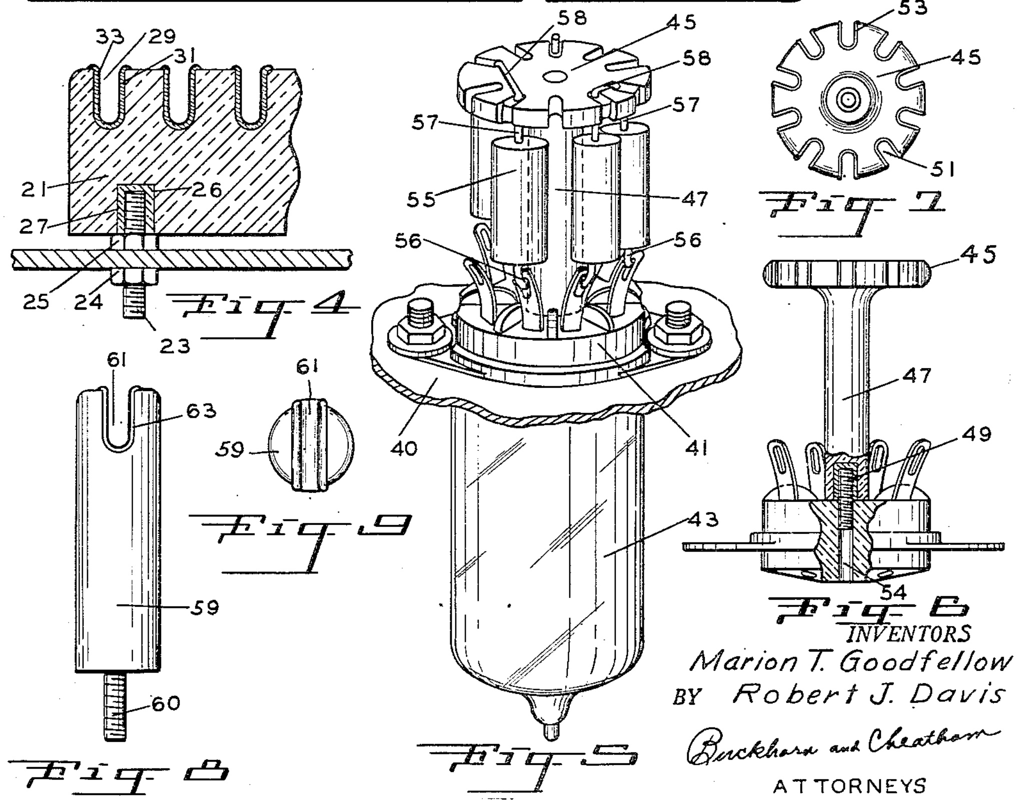
Fig. 4 is an enlarged, fragmentary, longitudinal, sectional view through one of the mounts shown in Fig. 3.
Fig. 5 is a perspective view of a still further modified form of the invention, which is mounted on a vacuum-type socket and supports a plurality of electrical components which are connected to the terminals of the vacuum tube socket.
Fig. 6 is a side elevational view of the terminal mount disclosed in Fig. 5, with parts broken away to show the manner of its connection with the vacuum tube socket.
Fig. 7 is a bottom view of the terminal mount disclosed in Fig. 6.
Fig. 8 is a side elevational view of another form of the invention.
Fig. 9 is a top view of the mount disclosed in Fig. 8.

Figs. 3 and 4 show a modified form of the invention wherein it is apparent that there are two terminal mounts secured to the underside of a sheet-metal chassis 19, the chassis having been inverted for convenience in explanation. Hence, the terms "up" and "down," "upper" and "lower," etc., will refer to the position of the parts shown in Fig. 3, since this is the position of the parts at the time the electrical conponents are connected in place.

Each terminal mount includes a generally rectangular strip of insulating material 21 having depending threaded studs 23 extending through the base of the chassis and being secured thereto by nuts 24 threaded up against the chassis. Preferably each stud is provided with a stand-off nut 25. The studs are received at their upper ends in holes 26 formed in the lower edge of strip 21 and secured in place by cement 27 (see Fig. 4). The particular mount shown has a generally triangular cross-sectional shape in which the apex is rounded, as is apparent from Fig. 3.

Formed along the upper edge of strip 21 is a plurality of spaced, wire-receiving notches 29. Each notch is lined with a thin layer of metal 31 permanently bonded to the portion of the insulating strip defining the notch. These linings may be formed by coating the notches with a thin layer of electrically conducting silver paste, of a composition to be given hereinafter, and then firing the thus formed article to a temperature to harden the silver paste and form a permanent bond thereof with the insulating strip.

Partly or entirely covering each lining is a coating of soft solder 33, the cohesion of which, when in its flowable state, is less than its adhesion for the lining and greater than its adhesion for the adjacent strip 21. Preferably the strip is of ceramic material and has a glazed surface to increase its capability for repelling flowable solder.

In use, the terminal mounts are conventionally mounted on the underside of the base of a metal chassis in such spaced relation that the leads 35 of electrical components 37, to be supported by the terminal mounts, may be merely laid in the notches of the mounts. Previous to placing the leads within the notches, various jumpers 38, which may comprise U-shaped wires having bent ends, have theier ends placed within the notches. The leads of the components may now be placed in the notches, then a hot soldering iron successively placed against the laminated linings of the notches to bring the solder to a flowable state, whereupon simultaneously, additional solder may be added to insure the desired mechanical and electrical connection of the jumpers and leads to the linings of the notches. Because of the thinness of the linings 31, they may be quickly brought up to a temperature to melt the solder, and thus the leads of the electrical components may be secured within the notches well prior to the time that heat sufficient to harm the component bodies is conveyed to them through the leads.

It is apparent in Fig. 3 that the space between the terminal mounts may be employed to mount a vacuum tube socket, such as socket 39, or other element. Normally the socket will be mounted in place and properly wired, prior to the time that the electrical components 37 are mounted on the terminal mounts.

Now referring to Figs. 5, 6 and 7, there is shown, fragmentarily, a sheet-metal chassis 40 having mounted thereon a vacuum tube socket 41 supporting a vacuum tube 43. Mounted on the other side of the socket, in a manner to be presently explained, is a third form of terminal mount. This mount has a body of insulating material and includes a disc-shaped head 45 from which centrally extends a stem 47, the lower end of which is formed with a hole within which the upper end of a threaded stud 49 is cemented.

The circumferential edge of head 45 is formed with a plurality of circumferentially spaced, radial notches 51 each lined with a thin laminated lining 53, comprising an inner lamina of a metal having a considerably higher melting point than soft solder, and an outer lamina of soft solder. The spacing of the notches may be the same as that of the terminals of the socket whereby the notches may be arranged in registry with the socket terminals.

In use, the stud 49 is threaded into the central hole 54 conventionally provided in a vacuum tube socket, until the stem is brought against the adjacent surface of the socket and the notches of the head register with the socket terminals. Various electrical components 55 then have their lower leads 56 soldered to the terminals of the vacuum tube socket, and thereafter their upper leads 57 are merely shoved into the notches 51. Some of these ends may be bent over to form jumpers 58. A hot soldering iron is now applied to the laminated linings of the notches to bring the solder of the linings to a flowable state, at which time additional solder may be added to effect the desired mechanical and electrical bond of the leads to the linings. It is to be understood that the amount of solder on a lining is sufficient of itself to form a bond with a wire lead. However, as a safety factor, additional solder may be added.

Figs. 8 and 9 show a further modified form of the invention wherein it is apparent that the terminal mount comprises a cylindrical post 59 of insulating material having depending therefrom a threaded stud 60, the upper end of which is received and cemented within a hole (not shown) formed centrally in the lower end of the post.

Formed across the upper end of the post is a notch 61 having a laminated lining 63 comprising an inner layer of metal permanently bonded to the portion of the post defining the notch, and an outer layer of soft solder covering the metal layer. As in the previously described forms of the invention, the inner metal layer has a considerably higher melting point than the soldier.

In use, the stud 60 may be inserted into a hole in a chassis base and a nut threaded on the end of the stud up against the chassis. A stand-off nut may be employed if desired. Then several or more leads may be placed in notch 61 and a hot iron applied to flow the solder. Additional solder may be added if desired. The posts may be used in pairs to support electrical components away from the chassis, particularly in high voltage instruments.

It is preferable that the insulating bodies of the various terminal mounts heretofore mentioned be composed of ceramic material. Preferably the ceramic material is high-voltage porcelain. One method of making the Figs. 3 and 4 form of the invention will be explained, and by this method it will be clear as to how the other forms of the invention may be produced. It will be distinctly understood that the following compositions and percentages are not intended to limit the invention and are merely given by way of example.

Many porcelain mixes may be employed, but the following is typical. The percentages indicate amounts by weight.

| | Percent |
|---|---|
| Silica | 24 |
| Feldspar | 33 |
| Ball clay | 17 |
| Kaolin | 26 |
| | 100 |

The above materials are blended together and wet ground in a ball mill until they pass through a 200-mesh screen, sufficient water and sodium silicate having been added to these materials to make a pourable mass. Suitable plaster molds are provided and formed with appropriate cavities conforming to the shape of the insulating bodies to be formed. These cavities are filled with the pourable mass and, upon partial drying, the cast pieces shrink and may be readily removed from the plaster molds. This process is widely known as slip casting. These pieces could also be formed by pressing or extruding.

At this time the stud-receiving holes are drilled in the relatively soft pieces, and then the pieces are dipped in a liquid glaze solution which is permitted to dry. Many glaze solutions may be employed, the following being typical. The percentages indicate amounts by weight.

| | Percent |
|---|---|
| Feldspar | 44.0 |
| Silica | 25.2 |
| Kaolin | 10.1 |
| Whiting (calcium carbonate) | 18.7 |
| Borax | 2.0 |
| | 100.0 |

The notches are now formed in the upper edge of a strip, a convenient way being to present the upper edge of the strip to a gang saw wherein the blades of the saw are spaced apart distances conforming to the desired spacing of the notches to be formed. Preferably the notches have round bottoms to avoid stress concentration at such places.

The thus formed articles are now placed in a kiln and fired to about pyrometric cone 10. After removal and cooling, the slots are coated with a silver paste which, by way of example, may comprise 60 to 75 percent silver, the remainder being a binder such as squeegee oil and a thinner such as turpentine. The notches may be coated by providing a rakelike implement in which the tines are wires of a size slightly less than that of the notches and spaced to fit within the notches. This rake is dipped in the silver paste, which is rather more a liquid than a paste, and then passed into the notches to apply a thin lining to every notch. Preferably the operation is carried out so that the silver coats somewhat around the corners of the notches, as is best shown in Figs. 4 and 8.

The thus formed articles are now dried and then fired to about 1350° F. to harden the silver and form a permanent bond between the silver linings and the ceramic material. In order to assure that flowable solder will readily coat the linings, they may be subjected to nitric acid, or they may be sandblasted, or buffed. This step insures the removal of any oxide or similar coating on the silver lining which would be a deterrent to the adherence of flowable solder to the lining. The notched end of a strip is now dipped into a molten bath of soft solder, and just as the strip is withdrawn from the solder it is shaken to remove excess solder from the notches. Thus the detail of the notches is retained. The term "soft solder" when employed in this description and the claims is meant to include those solders, such as tin-lead solders, which readily melt at a relatively low temperature.

The solder composition, by way of example, may comprise about 65 percent tin, 32 percent lead, and about 3 percent silver. These percentages may obviously be varied. The lead has a tendency to alloy with the silver; hence that is the reason why a small percentage of silver is added to the solder, this assuring that the solder will not attack the silver linings bonded to the strip, upon application of the solder to the linings. A solder of a similar composition may be employed when it is desired to supply additional solder at the time the leads are being connected within the notches.

At this time it is convenient to secure the studs within the holes. This may be accomplished by dipping the upper ends of the studs in a porcelain cement, generally termed spark-plug cement, and also partially filling the stud holes with the cement. The coated ends of the studs are then inserted into the holes and the cement allowed to set.

From the above description it is apparent how the other forms of the invention may be produced.

Although only notches are shown in the form of the invention disclosed in Figs. 3 and 4, and also in the forms of the invention disclosed in Figs. 5 to 9, these notches could as well be holes, slots, recesses, and the like, where the peculiar circumstances of the situation make it desirable to have such shapes. However, the notch design is preferable when a bank of electrical components, such as shown in Figs. 3 and 5, are to be mounted on or connected to the terminal mounts. The advantage of the notch construction is that the leads of the electrical components can be merely laid in the notches and soldered in place without having to insert them through holes or slots, as would be the case if holes or slots were provided.

It is apparent that the manner of securing the threaded studs to the mount bodies is merely optional and, in fact, the use of studs is optional, since any other convenient securing means may be employed. Also, the invention is not intended to be limited to the use of silver linings for the notches, since copper and platinum, for instance, may be employed.

The particular forms of the invention shown are preferable, but the invention is by no means limited to these particular forms. Whatever form the terminal mount assumes, all terminal mounts embodying the concepts of the present invention have the following advantageous features. Each metalized area on a ceramic body has a mass only a small fraction of that of a conventional terminal post, and hence it can be heated to the temperature of flowable solder in only a fraction of the time required to heat a conventional post to such temperature, and will store only a fraction of the heat stored by a post. Thus, excess heat is not transmitted through leads to component bodies, and therefore the component bodies are not damaged. This means that a more compact arrangement of parts may be attained because the lead length from a component body to the adjacent terminal element may be made very short without damaging the component body.

As further explanation of the above matter, it is pointed out that the conventionel post has a mass of about five decigrams whereas a lining of a notch of a typical terminal mount constructed in accordance with the present invention has a mass of about one-tenth of a decigram. Thus, the mass of a silver lining may be only one-fiftieth of the mass of a post. Therefore, the time necessary to heat up such a lining is obviously only a fraction of that necessary to heat up a post.

Because of the good thermal insulating qualities of the ceramic bodies, the solder of adjacent notches is not affected when the lining of a selected notch is being heated. Another advantage resulting from the quick heating time of a lining is that considerably less heat is taken from the soldering iron, so that an assembler does not have to contend with switching irons when soldering down a row of notches.

Because of the excellent electrical insulating properties of the ceramic bodies, the terminal mounts of the present invention are ideally suited for use in high voltage instruments.

A main advantage of the mounts of the present invention is that it is not necessary to preform or precurve the ends of the leads of electrical components to fit posts or the like, since the straight ends of such leads may be merely laid in the notches or against the metalized spots, depending on the form of the invention, and a heated soldering iron applied successively to the notches or spots. Because the cohesion of the flowable solder is less than its adhesion to the silver linings, but much greater than its adhesion to the glazed surface of a mount body, the flowable solder will remain confined to the silver linings. If excess solder is applied, the capillary action of a notch holds some of the excess, while the remainder merely runs down the glazed surfaces of the mount body without wetting or adhering to it.

A further advantage of the mounts of the present invention is that, although they are superior products as compared with mounts now on the market, they are less expensive than mounts now in use. This is evident when a comparison is made between the low cost of ceramic materials and the higher cost of Bakelite and plastic or plastic-impregnated pieces, and between the ease and rapidity with which the silver linings may be applied to ceramic bodies and the expense and time required to secure terminal posts or clips to Bakelite and plastic or plastic-impregnated pieces.

The form of the invention disclosed in Figs. 3 and 4 has advantages peculiar to itself. The terminal mounts occupy very little space on a chassis and, because the electrical components are supported free and clear of the chassis, the space between the terminal mounts may be usefully employed for mounting other electrical instrumentalities, such as tube sockets and the like. Because of the small amount of heat generated during a soldering operation, it is not necessary to bend the wire leads of a component body to obtain greater lead length. The leads may be left straight since even with the resulting shorter lead length between a component body and the terminals to which its leads are soldered, no harm to the bodies will result.

The form of the invention disclosed in Figs. 5, 6 and 7 has advantages peculiar to itself. Such a mount may be readily secured to a vacuum tube socket and, when so secured, provides a plurality of wire receiving notches therearound in registry with the terminals of the vacuum tube socket. Thus, electrical components may have their leads readily electrically and mechanically secured to the terminals of the vacuum tube socket and to the notches of the head of the terminal mount, and may therefore be compactly arranged and disposed close to the vacuum tube mounted in the vacuum tube socket. It is pointed out that, when electrical components are secured in place, the component bodies are in part accommodated beneath the head of the terminal mount. The notches of the form of the invention disclosed in Figs. 5, 6 and 7, as well as those shown in Figs. 3 and 4, and 8 and 9, are deep enough so that several or more leads may be received therein. Thus, jumpers and other wires may be placed within the notches and secured thereto to form the circuit desired.

In the particular forms of the invention disclosed, the amount of solder carried by the silver inserts or linings is sufficient by itself, when heated, to provide a mechanical and electrical bond of leads to the notch. However, as a safety factor, additional solder will usually be added to fill a notch.

In all the forms of the invention except the one shown in Figs. 1 and 2, the silver inserts or linings, which are permanently bonded to the ceramic bodies, are coated with a layer of solder. This is the preferable form of the invention because exposed silver linings have a tendency to form an oxide coating on their surfaces to which flowable solder does not readily adhere. By applying a coating of solder to the silver before such an oxide coating can form, or after such a coating has been removed, the solder readily adheres to the silver and, furthermore, the notches are in condition for ready application of additional solder thereto, if additional solder is to be employed.

Having thus described the invention in what are considered to be preferred embodiments thereof, it is desired that it be understood that the specific details shown are merely illustrative and that the invention may be carried out in other ways.

What we claim as our invention is:

1. A terminal mount comprising an integral body of ceramic electrical insulating material having a portion provided with a wire-receiving notch extending transversely therethrough, said notch being of uniform width and of substantially greater depth than width whereby a wire positioned in said notch will be positioned wholly beneath the top edges thereof, and a laminated metallic lining covering the surface of said material within said notch, said lining comprising a thin coating of silver on said surface and an outer adherent coating of soft solder on the first-mentioned coating.

2. A terminal mount comprising an integral body of ceramic electrical insulating material having a portion provided with a wire receiving notch extending transversely therethrough, said notch being of uniform width and of substantially greater depth than width, whereby a wire positioned in said notch will be positioned wholly beneath the edges thereof, and a laminated metallic lining covering the surface of said material within said notch, said lining comprising a thin coating on said surface of a metal having a substantially higher melting point than soft solder and an outer adherent coating of soft solder on the first mentioned coating.

References Cited in the file of this patent

UNITED STATES PATENTS

| | | |
|---|---|---|
| 2,009,094 | Peters | July 23, 1935 |
| 2,229,582 | Osenberg | Jan. 21, 1941 |
| 2,398,176 | Deyrup | Apr. 9, 1946 |
| 2,442,968 | Bierwirth | June 8, 1948 |
| 2,524,939 | Stephan | Oct. 10, 1950 |
| 2,553,287 | Yates | May 15, 1951 |
| 2,588,082 | Brown | Mar. 4, 1952 |
| 2,596,237 | Gross et al. | May 13, 1952 |
| 2,619,519 | Marks | Nov. 25, 1952 |
| 2,624,775 | Hughes | Jan. 6, 1953 |
| 2,636,920 | Lockery | Apr. 28, 1953 |
| 2,644,066 | Glynn | June 30, 1953 |
| 2,693,584 | Pifer | Nov. 2, 1954 |
| 2,774,014 | Henry | Dec. 11, 1956 |

UNITED STATES PATENT OFFICE

CERTIFICATE OF CORRECTION

Patent No. 2,836,807

May 27, 1958

Marion T. Goodfellow et al.

It is hereby certified that error appears in the printed specification of the above numbered patent requiring correction and that the said Letters Patent should read as corrected below.

Column 1, line 18, for "componetns" read -- components --; column 4, line 11, for "theier" read -- their --; column 5, line 3, for "soldier" read -- solder --; column 7, line 4, for "conventionel" read -- conventional- column 8, line 62, list of references cited, for "2,229,582" read -- 2,229,585 --.

Signed and sealed this 5th day of August 1958.

(SEAL)
Attest:

KARL H. AXLINE
Attesting Officer

ROBERT C. WATSON
Commissioner of Patents